(12) United States Patent
Chen et al.

(10) Patent No.: US 10,008,624 B2
(45) Date of Patent: Jun. 26, 2018

(54) EMBEDDED JUNCTION IN HETERO-STRUCTURED BACK-SURFACE FIELD FOR PHOTOVOLTAIC DEVICES

(71) Applicant: International Business Machines Corporation, Armonk, NY (US)

(72) Inventors: Tze-Chiang Chen, Yorktown Heights, NY (US); Bahman Hekmatshoartabari, White Plains, NY (US); Devendra K. Sadana, Pleasantville, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 14/867,553

(22) Filed: Sep. 28, 2015

(65) Prior Publication Data

US 2016/0020344 A1      Jan. 21, 2016

Related U.S. Application Data

(63) Continuation of application No. 13/626,359, filed on Sep. 25, 2012, now Pat. No. 9,202,959.

(51) Int. Cl.
*H01L 31/056*      (2014.01)
*H01L 31/068*      (2012.01)
(Continued)

(52) U.S. Cl.
CPC ........ *H01L 31/0747* (2013.01); *H01L 31/028* (2013.01); *H01L 31/022458* (2013.01); *H01L 31/03682* (2013.01); *H01L 31/03762* (2013.01); *H01L 31/056* (2014.12); *H01L 31/068* (2013.01); *H01L 31/0682* (2013.01); *H01L 31/0684* (2013.01); *H01L 31/1804* (2013.01);
(Continued)

(58) Field of Classification Search
CPC . H01L 31/068; H01L 31/056; H01L 31/1804; H01L 31/0747; Y02E 10/50; Y02E 10/546; Y02E 10/547
USPC ................................ 136/252, 255, 258, 261
See application file for complete search history.

(56) References Cited

U.S. PATENT DOCUMENTS 4,547,622 A      10/1985   Fan et al.
5,342,435 A  *   8/1994    Walls ....................... B41N 3/08
                                                                101/451
(Continued)

FOREIGN PATENT DOCUMENTS

KR     20110047828 A     5/2011
WO     WO2011073868 A2   6/2011

*Primary Examiner* — Lindsey Bernier
(74) *Attorney, Agent, or Firm* — Tutunjian & Bitetto, P.C.; Louis J. Percello

(57) ABSTRACT

A photovoltaic device and method include a crystalline substrate and an emitter contact portion formed in contact with the substrate. A back-surface-field junction includes a homogeneous junction layer formed in contact with the crystalline substrate and having a same conductivity type and a higher active doping density than that of the substrate. The homogeneous junction layer includes a thickness less than a diffusion length of minority carriers in the homogeneous junction layer. A passivation layer is formed in contact with the homogeneous junction layer opposite the substrate, which is either undoped or has the same conductivity type as that of the substrate.

18 Claims, 6 Drawing Sheets

(51) Int. Cl.
 *H01L 31/0747* (2012.01)
 *H01L 31/18* (2006.01)
 *H01L 31/0224* (2006.01)
 *H01L 31/028* (2006.01)
 *H01L 31/0368* (2006.01)
 *H01L 31/0376* (2006.01)

(52) U.S. Cl.
 CPC .............. *Y02E 10/50* (2013.01); *Y02E 10/52* (2013.01); *Y02E 10/546* (2013.01); *Y02E 10/547* (2013.01); *Y02P 70/521* (2015.11)

(56) References Cited

U.S. PATENT DOCUMENTS

| | | | |
|---|---|---|---|
| 5,627,081 A * | 5/1997 | Tsuo | H01L 31/0236 136/258 |
| 5,935,345 A * | 8/1999 | Kuznicki | H01L 31/068 136/255 |
| 5,944,913 A | 8/1999 | Hou et al. | |
| 7,553,691 B2 | 6/2009 | Fatemi et al. | |
| 8,906,734 B2 * | 12/2014 | Chen | H01L 31/068 438/96 |
| 9,202,959 B2 * | 12/2015 | Chen | H01L 31/068 |
| 2002/0011264 A1 * | 1/2002 | Saito | H01L 31/03685 136/258 |
| 2006/0255340 A1 * | 11/2006 | Manivannan | H01L 31/02168 257/79 |
| 2008/0283120 A1 * | 11/2008 | Komatsu | H01L 31/0747 136/258 |
| 2009/0120494 A1 * | 5/2009 | Moon | H01L 31/02246 136/256 |
| 2011/0265866 A1 * | 11/2011 | Oh | H01L 31/02167 136/255 |
| 2011/0277826 A1 * | 11/2011 | Lee | H01L 31/022425 136/255 |
| 2012/0132250 A1 | 5/2012 | Cornfeld | |
| 2012/0171806 A1 | 7/2012 | Meier et al. | |
| 2012/0211068 A1 | 8/2012 | Cornfeld et al. | |
| 2013/0171767 A1 | 7/2013 | Moslehi et al. | |

* cited by examiner

EMBEDDED JUNCTION IN HETERO-STRUCTURED BACK-SURFACE FIELD FOR PHOTOVOLTAIC DEVICES

BACKGROUND

Technical Field

The present invention relates to photovoltaic devices and methods for manufacture, and more particularly to a hetero-structured device with an embedded homogeneous junction.

Description of the Related Art

In conventional heterojunction (HJ) solar cells, known as a heterojunction with thin intrinsic layers (HIT cells), a back surface field (BSF) contact is comprised of a thin intrinsic (i) hydrogenated amorphous silicon (a-Si:H) layer to passivate the back surface of a crystalline Si (c-Si) substrate and a doped layer of a-Si:H having the same conductivity type as that of the c-Si substrate to establish an electric field to repel minority carriers (electrons in the case of p-type substrate, and holes in the case of n-type substrate) from the back surface of the c-Si substrate. If the HJ solar cell is used in a bifacial mode, which includes light collection from both the backside of the cell and a front side, backside collection is limited by absorption in the doped layer and intrinsic a-Si:H layer.

SUMMARY

A photovoltaic device includes a crystalline substrate, an emitter contact portion formed in contact with the substrate and a back-surface-field junction. The back-surface-field junction includes a homogeneous junction layer in contact with the crystalline substrate having a same conductivity type and a higher active doping density than that of the substrate, wherein the homogeneous junction layer includes a thickness less than a diffusion length of minority carriers in the homogeneous junction layer. A passivation layer is formed in contact with the homogeneous junction layer opposite the substrate, which is either doped or undoped.

Another photovoltaic device includes a substrate comprised of mono-crystalline or multi-crystalline material, an emitter contact portion formed in contact with the substrate and a back-surface-field junction. The back-surface-field junction includes a homogeneous junction layer in contact with the substrate, the homogeneous junction layer including a hydrogenated single-crystalline or poly-crystalline material having a same conductivity type and a higher active doping density than that of the substrate, wherein the homogeneous junction layer includes a thickness less than a diffusion length of minority carriers in the homogeneous junction layer. A passivation layer is formed in contact with the homogeneous junction layer opposite the substrate, which is either doped or undoped. A conductive contact portion is also formed.

Yet another photovoltaic device includes an emitter, a doped mono-crystalline or multi-crystalline Si substrate coupled to the emitter and a doped crystalline layer formed directly on the substrate opposite the emitter and having hydrogenated single-crystalline or poly-crystalline Si material that includes an active doping density in the range of about $10^{18}$ to about $3\times10^{20}$ cm$^{-3}$ and a thickness between about 1 and 25 nm. A doped hydrogenated non-crystalline material is formed on the doped crystalline layer and includes a thickness in the range of about 2 to about 20 nmm, wherein the substrate, crystalline layer and non-crystalline material include a same dopant conductivity.

A method for forming a photovoltaic device includes providing a crystalline substrate; forming an emitter contact portion in contact with the substrate; and forming a back-surface-field junction by: forming a homogeneous junction layer in contact with the crystalline substrate having a same conductivity type and a higher active doping density than that of the substrate, wherein homogeneous junction layer includes a thickness less than a diffusion length of minority carriers in the homogeneous junction layer; and forming a passivation layer formed on the homogeneous junction layer opposite the substrate, which is either undoped or has the same conductivity type as that of the substrate.

Another method for forming a photovoltaic device includes providing a crystalline substrate; forming a emitter contact portion in contact with the substrate; and forming a back-surface-field junction by: forming a homogeneous junction layer in contact with the crystalline substrate, the homogeneous junction layer including a hydrogenated single-crystalline or poly-crystalline material and having a same conductivity type and a higher active doping density than that of the substrate, wherein the homogeneous junction layer includes a thickness less than a diffusion length of minority carriers in the homogeneous junction layer; and forming a hydrogenated amorphous, nano-crystalline or micro-crystalline material including a same element as the homogeneous junction layer as a passivation layer on the homogeneous junction layer opposite the substrate, the passivation layer being either undoped or having the same conductivity type as that of the substrate.

Another method for forming a photovoltaic device includes providing a doped mono-crystalline or multi-crystalline Si substrate; forming an emitter on the substrate; forming a doped crystalline layer directly on the substrate having hydrogenated single-crystalline or poly-crystalline Si material that includes an active doping density in the range of about $10^{18}$ to about $3\times10^{20}$ cm$^{-3}$ and a thickness between about 1 and 25 nm; and forming a doped hydrogenated non-crystalline material formed on the doped crystalline layer including a thickness in the range of about 2 to about 20 nm, wherein the substrate, crystalline layer and non-crystalline material include a same dopant conductivity.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
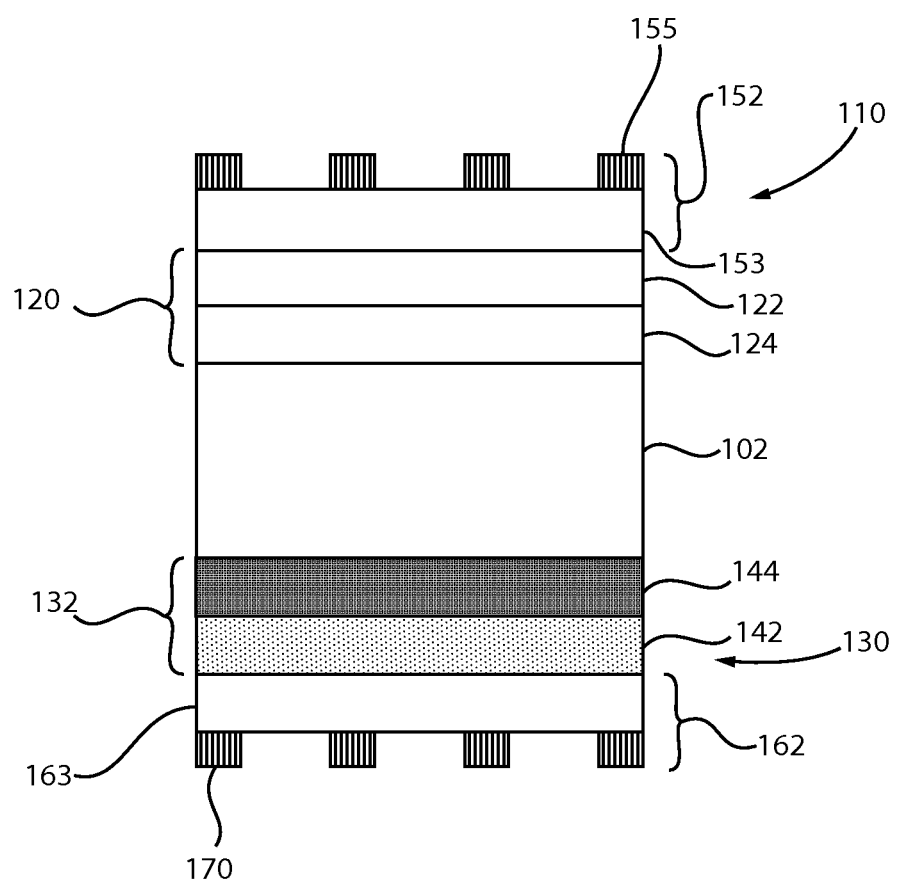
FIG. 1 is a cross-sectional view of a heterojunction device having a back surface field contact portion with an embedded homogeneous junction replacing an intrinsic layer of a heterogeneous structure in accordance with the present principles.

In accordance with the present principles, photovoltaic devices and methods for formation are disclosed. In particularly useful embodiments, a back surface field contact, which is comprised of a heterojunction with an embedded homojunction, is formed. The homojunction may include a single-crystalline or polycrystalline doped layer having a conductivity type the same as that of an absorption region (substrate) and a thickness smaller than a diffusion length of minority carriers in the single-crystalline or polycrystalline doped layer. In some embodiments, the back surface field offers one or more of the following advantages compared to a conventional heterojunction back surface field contact with an intrinsic thin layer: (i) more efficient light collection from the backside due to lower absorption loss in the back surface field layers, resulting in a higher solar cell short circuit current ; (ii) higher solar cell fill-factor due to effectively lower band offsets between the back surface field layer and the absorption region (substrate); (iii) better passivation of the back surface of the absorption region (substrate) and therefore a higher solar cell open circuit voltage. Note that this is a non-exhaustive list and other advantages may be achieved and are contemplated.

It is to be understood that the present invention will be described in terms of a given illustrative architecture having substrates and illustrative photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer or substrate. The photolithographic masks may be utilized to define areas of the substrate (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer or substrate that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc. The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It should be noted that the listings of compounds and forms of the compounds are for illustrative purposes and ease of understanding and should not be construed as limiting. For example, a substrate may include the layer c-Si or c-SiGe; however, other forms of silicon or silicon-germanium (polycrystalline, nano/microcrystalline and single crystalline) may also be employed. Notations such as SiGe or SiC include any ratio of these compounds such as $Si_{1-x}Ge_x$ or $Si_{1-y}C_y$. These compounds may take different forms as well, e.g., polycrystalline, nano/microcrystalline, single crystalline or even amorphous.

Referring now to the drawings in which like numerals represent the same or similar elements and initially to FIG. 1, an illustrative structure of a photovoltaic device 100 is shown with an n-type substrate 102 being illustratively described. The present embodiments are applicable to p-doped substrates as well with corresponding layers being appropriately doped to work as intended. The substrate 102 preferably includes silicon and may be single-crystalline (c-Si) or microcrystalline (μc-Si). The single (or mono) crystalline structure may have any crystal or crystalline orientation. In accordance with the present principles, an emitter side 110 of the substrate 102 includes a stack 120 of layers or structures. The stack 120 includes a doped layer (e.g., p+ dopants) 122, and an intrinsic layer (i-layer) 124. Semiconducting material(s) forming passivation intrinsic layers or i-layer(s) 124 may include a-Si:H, a-Ge:H, a-Si-Ge$_x$:H, a-SiN$_x$:H, a-SiO$_x$:H, a-SiC$_x$:H, or combinations of these materials. The semiconducting material(s) forming doped layer 122 may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen. The films forming the doped layer 122 may or may not contain fluorine or deuterium. In one example, the doped layer 122 includes a p+ doped a-Si:H layer and the intrinsic layer 124 includes an a-Si:H layer. The thickness of each of the layers 122 and 124 is preferably less than 20 nm.

The emitter side 110 may include a conductive layer 152 that connects with the emitter side 110 stack 120. The conductive layer 152 may include a transparent conductive oxide (TCO) 153, such as indium tin oxide, zinc oxide, etc. Other structures may also be included such as conductive fingers 155, anti-reflection coatings, protective coatings, etc. The conductive fingers 155 may include, e.g., aluminum, silver, tungsten, etc.

The electric field at the emitter (front) junction 110 is set up by the doped a-Si:H layer 122 having a doping type opposite to that of the c-Si substrate 102, e.g. if the c-Si substrate 102 is n-type, the a-Si:H layer 122 is p$^+$ doped, and if the c-Si is p-type, the a-Si:H layer 122 is n$^+$ doped.

Opposite the emitter side 110 is a back side 130. The back side 130 may include a conductive layer 162 as well. The conductive layer 164 on the back side 130 may connect with a stack 132 of layers or structures. The conductive layer 162 may include a transparent conductive oxide (TCO) 163, such as indium tin oxide (ITO), zinc oxide, or aluminum-doped zinc-oxide (ZnO:Al), etc. Other structures may be included as well. For example, antireflection coatings (ARC) may be formed or conductive fingers 170 may be employed. The conductive fingers 170 may include, e.g., aluminum, silver, tungsten, etc. and may be patterned (e.g., in a bifacial device). Otherwise, instead of fingers 170, a contiguous conductive layer may be formed as a reflector.

At least one of layers 152 and 162 includes a transparent conductive material to permit light to enter the absorption layer 102 (substrate). A TCO material is used to reduce the sheet resistance of the front and/or back contacts of the solar cell. The thickness of the TCO layer may be in the range of 70-110 nm, for best anti-reflection properties.

If both layers 152 and 162 are composed of transparent conductive materials, the light can enter from both sides of the cell, and the cell is referred to as a bifacial cell. Otherwise, the cell is referred to as a monofacial cell (light received from one direction only). If layer 152 (or 162) is composed of a transparent conductive material, metal fingers 155 (or 170) may be needed to allow for low electrical contact resistance, while if layer 152 (or 162) is composed of a metal, the electrical conductivity of the contact is sufficient and the metal fingers 155 (or 170) are not needed. The metal used for layer 152 or 162 may have reflective properties.

The TCO layer 153 (or 163) also serves as an anti-reflection coating (ARC) in the front contact of a monofacial structure, and the front and back contacts of the bifacial structure. The TCO layer may also enhance reflection from the backside of the monofacial structure in conjunction with a reflective back contact metal electrode. In both monofacial and bifacial structures, the TCO layer also serves as a barrier against the diffusion of metal into nearby thin a-Si:H layers.

A passivation layer 142 contacts the conductive layer 162. In one embodiment, this layer 142 includes an n+ doped a-Si:H, which may include a thickness of less than 20 nm. Layer 142 may also be undoped.

A conventional stack normally includes an intrinsic layer similar to the layer 124 on the emitter side 110, which would be placed at the location of layer 142, that is, the conventional intrinsic layer would be in the position between the substrate 102 and the layer 142. The thickness of the conventional intrinsic a-Si:H layer would typically be in the range of 3-10 nm.

However, in accordance with the present principles, the intrinsic a-Si:H layer conventionally used to passivate the backside of HIT cells is replaced by a thin layer of hydrogenated crystalline silicon (c-Si:H) or poly-crystalline layer 144 having a same doping type as that of the c-Si substrate 102. The c-Si:H layer 144 may be single-crystalline, poly-crystalline and/or include non-crystalline portions (e.g., nano-crystalline, micro-crystalline, amorphous or combinations thereof). The doped c-Si layer 144 forms an embedded homojunction with the c-Si substrate 102. The doped c-Si layer 144 has an active doping level higher than that of the c-Si substrate 102.

The electric field at the back surface field junction may be set up by the doped a-Si:H layer 142 having a same doping type as that of the c-Si substrate 102, e.g., if the c-Si substrate 102 is n-type, the a-Si:H layer 142 is n$^+$ doped, and if the c-Si substrate 102 is p-type, the a-Si:H layer 142 is p$^+$ doped. The thickness of the doped a-Si:H layers 122, 142 are in the range of 3-15 nm, although thinner or thicker layers may be used as well.

In one example where the active doping level of the c-Si substrate 102 is in the range of between $10^{14}$ cm$^{-3}$ and $5\times10^{18}$ cm$^{-3}$, the active doping level of the c-Si:H layer 144 is in the range of between about $10^{16}$ cm$^{-3}$ and about $3\times10^{20}$ cm$^{-3}$. In another example where the active doping level of the c-Si substrate 102 is in the range of between $10^{16}$ cm$^{-3}$ and $5\times10^{17}$ cm$^{-3}$, the active doping level of the c-Si:H layer 144 is in the range of between about $10^{18}$ cm$^{-3}$ and about $10^{20}$ cm$^{-3}$. A thickness of the doped c-Si:H layer 144 is less than a diffusion length of minority carriers in the doped c-Si:H layer 144.

When a light source creates electron-hole pairs (charger carriers) within a semiconductor, the carriers diffuse through the bulk before reaching a surface depletion region. The photogenerated minority carriers may recombine with the much more numerous majority carriers before reaching the surface. The change in surface potential upon illumination is therefore a measure of the ability of minority carriers to reach the surface, namely, the minority carrier diffusion length. It should be noted that at higher doping levels (e.g., above $10^{19}$ cm$^{-3}$), minority carrier lifetime may become comparable or exceed the majority carrier lifetime, depending on the material quality.

In one example, where the n$^+$ c-Si:H layer 144 has an active doping concentration in the range of $10^{19}$-$10^{20}$ cm$^{-3}$, the minority hole diffusion length in the n$^+$ c-Si:H of layer 144 is in the range of 50 nm-2 μm, and the thickness of the n$^+$ c-Si:H layer 144 is in the range of 1 nm-100 nm. In another example, where the n$^+$ c-Si:H layer 144 has an active doping concentration in the range of $10^{19}$-$10^{20}$ cm$^{-3}$, the minority hole diffusion length in the n$^+$ c-Si:H layer 144 is in the range of 50 nm -2 μm, and the thickness of the n$^+$ c-Si:H layer 144 is in the range of 1 nm-25 nm. In yet another example, where the n$^+$ c-Si:H layer 144 has an active doping concentration of about $5\times10^{19}$ cm$^{-3}$, the minority hole diffusion length in the n$^+$ c-Si:H layer 144 is in the range of 100 nm-1 μm, and the thickness of the n$^+$ c-Si:H layer 144 is in the range of 2 nm-15 nm.

The gas sources used for the growth of the c-Si:H layer 144 may include but are not limited to one or more of the following precursor gases: SiH$_4$ (silane), Si$_2$H$_4$ (disilane), SiH$_2$Cl$_2$ (dichlorosilane), SiF$_4$ (tetrafluorosilane), and combinations thereof. A dilution gas, such as an H$_2$ carrier/dilution gas may also be employed. The dilution gas to precursor gas flow ratio is preferably greater than 5, e.g., [H$_2$]/[SiH$_4$]>5. The dopant gases (flowed in-situ) may include but are not limited to PH$_3$ (phosphine) for n-type doping, and B$_2$H$_6$ (diborane) or TMB (tri-methyl-boron) for p-type doping.

The c-Si:H layer 144 may include also one or more of the following: germanium (Ge), nitrogen (N), oxygen (O), fluorine (F), deuterium (D), chlorine (Cl), carbon (C) or combinations thereof. The gas source used for Ge containing layers may include germane (GeH$_4$). The gas source used for C containing layers may include methane (CH$_4$), ethylene (C$_2$H$_4$), propylene (C$_3$H$_6$) but other sources may be employed (e.g., of the form $C_xH_y$) as well. One preferred technique for growing these materials is plasma-enhanced chemical vapor deposition (PECVD); however, other growth methods, such as, e.g., hot-wire chemical vapor deposition (HWCVD), etc. may be employed. Growth temperatures may be about 200° C.; however, growth temperatures in the range of room-temperature to 450° C. may be used. The c-Si:H layer 144 may include between about 5 atomic percent to about 40 atomic percent of hydrogen.

In one embodiment, epitaxial growth may be employed to form layer 144 or other layers of the device 100. Substrate 102 may include, e.g., a bulk monocrystalline silicon substrate, Ge, III-V substrates (e.g., GaAs), etc. In the present embodiment, silicon is a preferred substrate material for epitaxial growth; however, other crystalline substrate materials may also be employed in accordance with the present principles.

Epitaxial growth may include a highly doped or undoped silicon at temperatures around 150 degrees C. or greater on predetermined areas of the substrate 102. In one embodiment, selective epitaxial growth on c-silicon is performed in a hydrogen diluted silane environment using a plasma enhanced chemical vapor deposition process (PECVD). The gas ratio of hydrogen gas to silane gas ([H$_2$]/[SiH$_4$]) at 150 degrees C. is preferably between 0 to about 1000. In particularly useful embodiments, epitaxial growth of silicon begins at a gas ratio of about 5-10. The epitaxial Si quality is improved by increasing the hydrogen dilution, e.g., to 5 or greater. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) is preferably performed at deposition temperatures ranging from about room temperature to about 500 degrees C., and preferably from about 150 degrees C. to about 250 degrees C. Plasma power density may range from about 2 mW/cm$^2$ to about 2000 mW/cm$^2$. A deposition pressure range may be from about 10 mtorr to about 5 torr. The low-temperature epitaxial Si may be grown on different substrates, such as Si, Ge, and III-Vs.

The surface of the doped c-Si:H layer 144 is passivated by layer 142 which may include a thin hydrogenated non-crystalline Si layer which is either undoped or has the same conductivity type as that of the c-Si substrate 102 and the c-Si:H layer 144. For example, if the c-Si substrate 102 is n-type and the c-Si:H layer 144 is n$^+$ doped, the hydrogenated non-crystalline layer 142 is either undoped or n$^+$ doped. The term "non-crystalline" indicates that the material is amorphous, nano-crystalline or micro-crystalline. The hydrogenated non-crystalline material may include a-Si:H, however, other materials such as hydrogenated amorphous silicon carbide (a-SiC:H), hydrogenated amorphous silicon germanium (a-SiGe:H), or combinations thereof may be used as well. These layers may contain nitrogen (N), oxygen (O), fluorine (F), deuterium (D), chlorine (Cl) or combinations thereof. These materials may be grown by plasma-enhanced chemical vapor deposition (PECVD), however, other growth techniques, such as hot-wire CVD (HWCVD) or sputtering may be used as well. In-situ p-type doping may be performed using diborane (B$_2$H$_6$) or trimethylboron (TMB) sources and in-situ n-type doping may be performed using a phosphine (PH$_3$) gas source, although other dopant sources may be used as well. Ammonia (NH$_3$), nitrous oxide (N$_2$O) or other gas sources may be used for nitrogen containing layers. Carbon dioxide (CO$_2$), N$_2$O or O$_2$ may be used to provide oxygen for oxygen containing layers. A carrier gas such as hydrogen (H$_2$), deuterium (D$_2$) helium (He) or argon (Ar) may be used for any or all of the layers. The carrier gas may be pre-mixed with the gas sources or flowed simultaneously with the gas source at the time of growth. Growth temperatures are around 200° C., with highest quality films being grown at temperatures in the range of 150-250° C.; however growth temperatures in the range of room-temperature to 450° C. may be used.

It will be appreciated by those skilled in the art that the application of the disclosed back surface field (BSF) contact is not limited to solar cell devices with heterojunction (HJ) front contacts, and the disclosed BSF contact may be used in conjunction with any known solar cell front contact structure or structures.

Figure 2A:
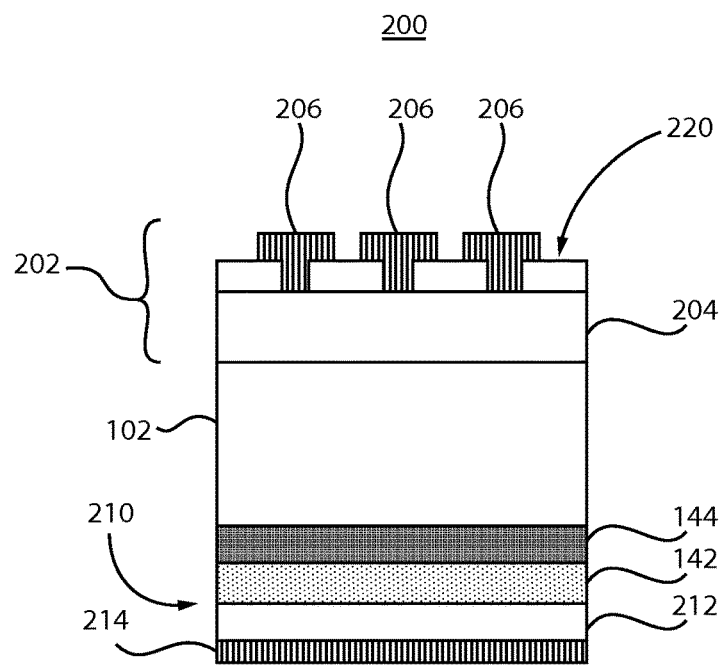
FIG. 2A is a cross-sectional view of a monofacial heterojunction solar cell with a single emitter front contact and a back-surface-field contact in accordance with the present principles.
Figure 2B:
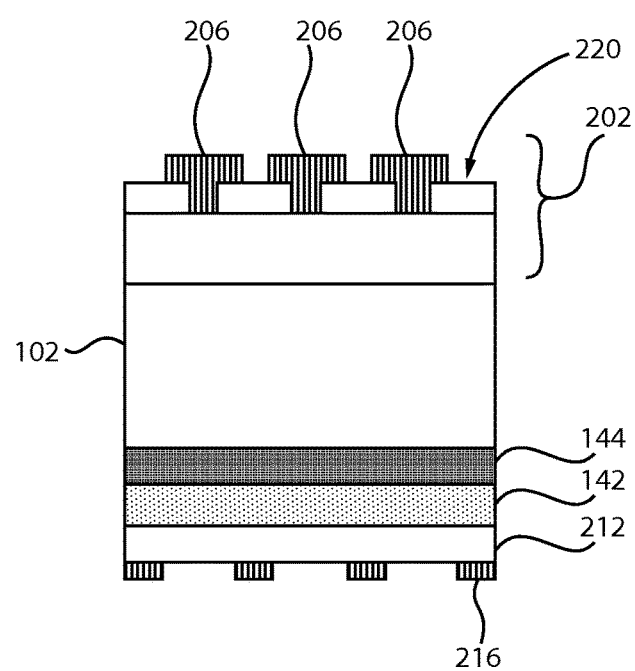
FIG. 2B is a cross-sectional view of a bifacial heterojunction solar cell with a single emitter front contact and a back-surface-field contact in accordance with the present principles.

Referring to FIGS. 2A and 2B, exemplary embodiments show a single-emitter front contact 202 wherein a p$^+$ doped region 204 forms an emitter junction. Emitter contacts 206 are formed through an antireflection coating 208. The p$^+$ doped region 204 may be formed with conventional techniques such as diffusion and/or implantation. FIG. 2A shows a monofacial embodiment and FIG. 2B shows a bifacial embodiment. A back contact conductive layer 214 is formed on a transparent conductive oxide (TCO) material 212 to reduce the sheet resistance on a back side 210 of a solar cell 200. The TCO layer 212 may also serve as an anti-reflection coating (ARC) 220 in the front contact of the monofacial structure, and the front and back contacts of the bifacial structure (FIG. 2B). The TCO layer 212 may also enhance reflection from the backside of the monofacial structure (FIG. 2A) in conjunction with a reflective back contact metal electrode (214). The electrode 214 may be patterned or otherwise formed into structures 216. In both monofacial and bifacial structures, the TCO layer 212 also may serve as a barrier against diffusion of metal into thin a-Si:H layers. The TCO layer 212 may include indium-tin-oxide (ITO) or aluminum-doped zinc-oxide (ZnO:Al), although other transparent conductive materials may be used as well. The thickness of the TCO layer 212 may be in the range of the range of 70-110 nm, for best anti-reflection properties.

Figure 3A:
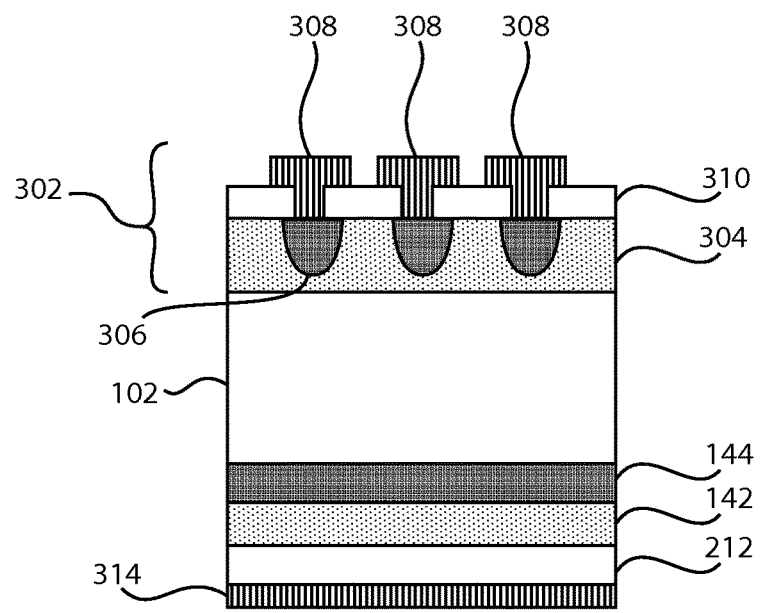
FIG. 3A is a cross-sectional view of a monofacial heterojunction solar cell with a double emitter front contact and a back-surface-field contact in accordance with the present principles.
Figure 3B:
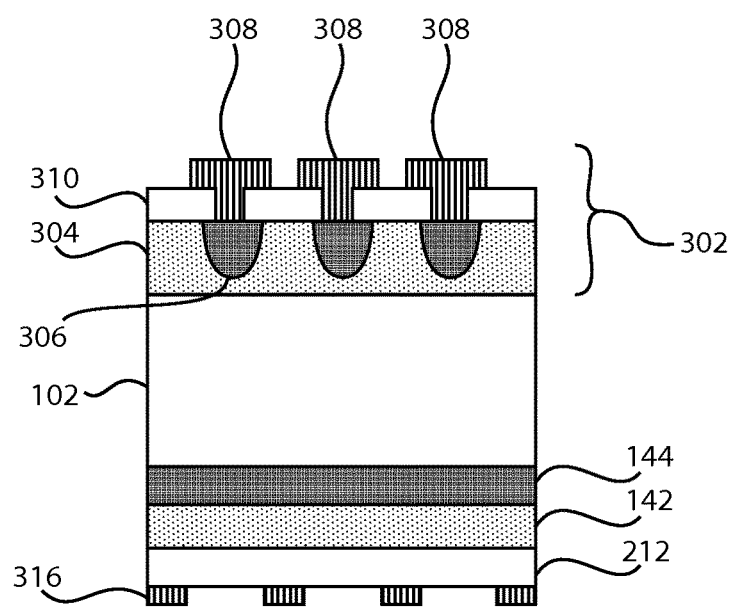
FIG. 3B is a cross-sectional view of a bifacial heterojunction solar cell with a double emitter front contact and a back-surface-field contact in accordance with the present principles.

Referring to FIGS. 3A and 3B, exemplary embodiments are depicted with a double-emitter front contact 302 wherein a p$^+$ doped region 304 forms an emitter junction and p$^{++}$ doped regions 306 passivate the emitter surface of the c-Si substrate 102 at metal contact areas with metal emitter contacts 308. An ARC 310 may be comprised of silicon dioxide, silicon nitride or combinations thereof, although other materials may be used as well. The ARC 310 may also serve to passivate the emitter surface of the c-Si substrate 102. The BSF structure in accordance with the present principles may be employed to form solar cells with a monofacial structure (FIG. 3A) or a bifacial structure (FIG. 3B).

The heterojunction solar cells shown in the FIGS. 2A-2B and 3A-2B include a thin intrinsic layer type cell (HIT cell) in both monofacial and bifacial configurations. In the monofacial structure (FIGS. 2A and 3A), the back contact electrode 214, 314 is comprised of a blanket metal layer and light enters from the front side of the cell through a front metal grid (contacts 202, 308). In the bifacial structure (FIGS. 2B and 3B), the back contact electrode is also comprised of a metal grid 216, 316, thereby allowing light to enter from both (front and back) sides.

By including the layer 144, in both monofacial and bifacial type cells, fill-factor is increased by 2-3% (absolute) or more, and overall efficiency improves by up to 2% (relative). This is due to the layer 144 reducing an effective band-offset between the conductive layer (TCO) 212 and the substrate 102, and by eliminating an intrinsic layer (e.g., i a-Si:H) normally employed on the backside of the photovoltaic cell. In the bifacial structure, the layer 144 improves light collection from the back-side by up to 5% (relative) and overall cell efficiency improvement by up to 2% (relative) by eliminating absorption.

Figure 4:
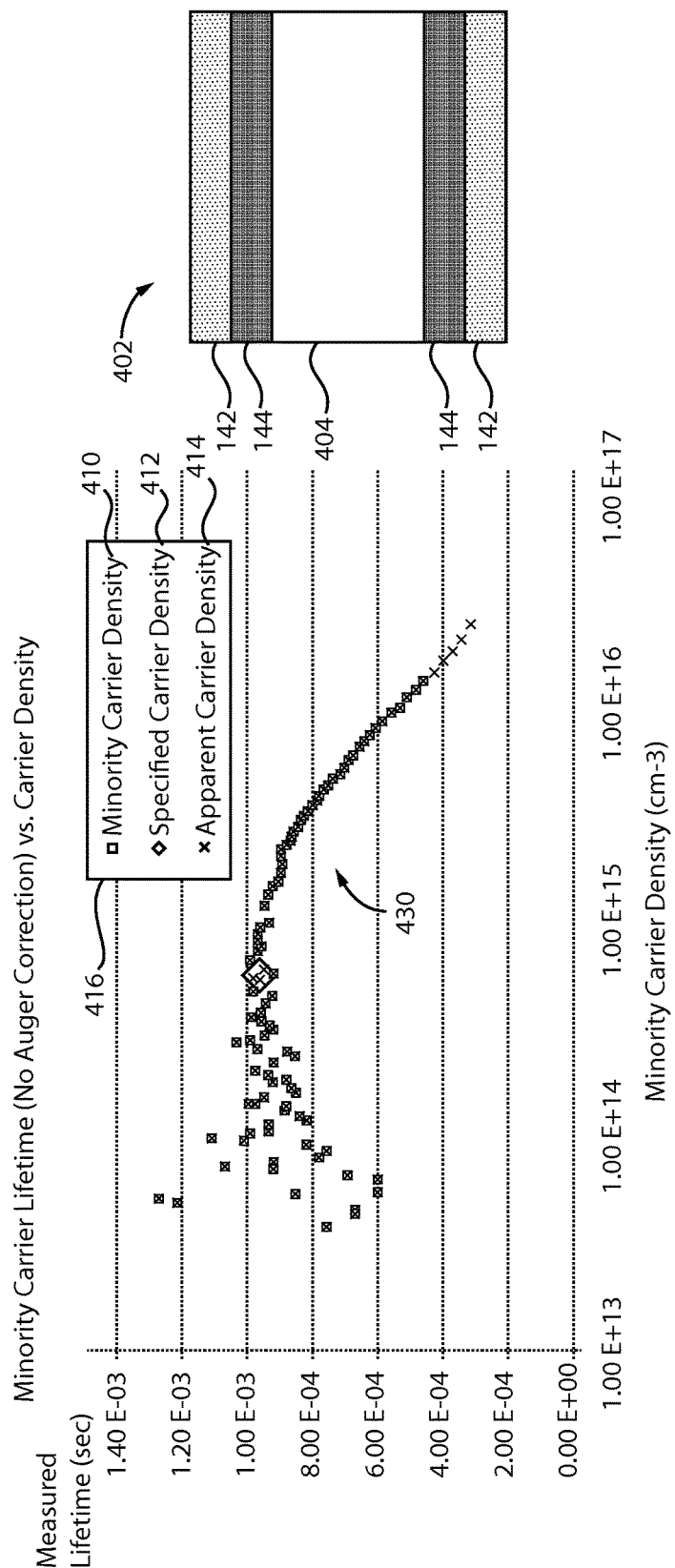
FIG. 4 is a plot of measured lifetime (seconds) (without Auger correction) versus minority carrier density ($cm^{-3}$) for the shown test structure in accordance with the present principles.

Referring to FIG. 4, a plot 430 of measured lifetime (seconds) (without Auger correction) versus minority carrier density ($cm^{-3}$) is illustratively shown using a test structure 402. The test structure 402 includes a substrate 404 and symmetrical arrangement of n-doped versions of layer 144 with n-doped non-crystalline layers 142. The substrate 404 was textured and included an n-type CZ (Czochralski) c-Si being 280 microns in thickness. The adjacent layers 144 in contact with the substrate 404 included n+ doped c-Si at 5 nm in thickness, and the undoped a-Si:H 142 is also 5 nm in thickness. The plot 430 shows minority carrier density 410, specific carrier density 412 and apparent carrier density 414 in accordance with a legend 416. The plot 430 represents photoconductance decay and demonstrates a very high lifetime, which is close to a bulk limit (the value produced if measured in bulk material of the same type). The plot 430 shows that excellent surface passivation is achieved using an embedded homogeneous junction in accordance with the present principles.

Figure 5:
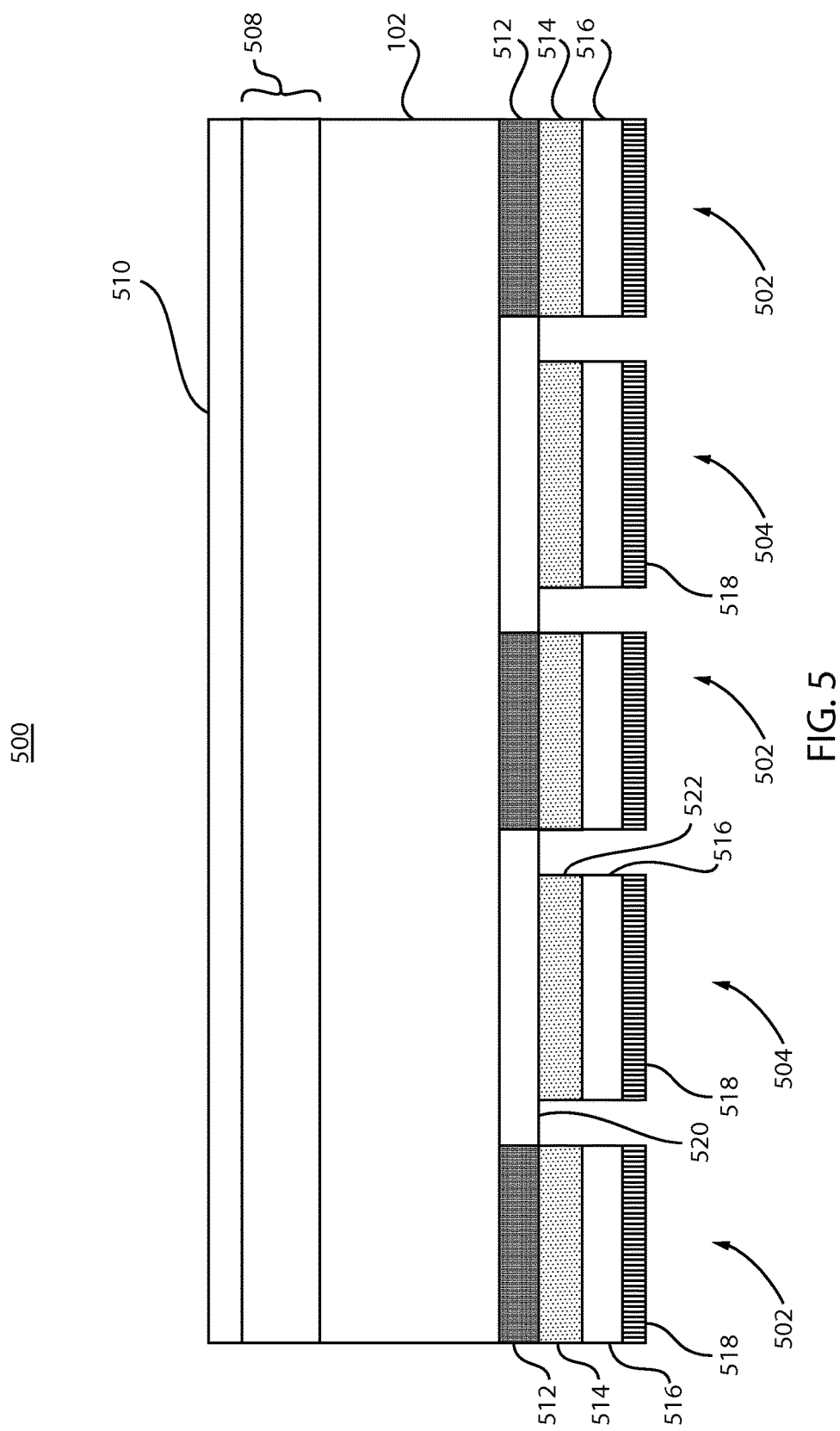
FIG. 5 is a cross-sectional view of an interdigitated back contact configuration heterojunction solar cell with a back-surface-field contact in accordance with the present principles.

Referring to FIG. 5, other structures may also be employed in accordance with the present principles. For example, FIG. 5 shows an interdigitated back contact (IBC) structure 500 where back surface field (BSF) contacts 502 and emitter contacts 504 alternate along a surface on a same side of a substrate 506, e.g., c-Si. The structure 500 may include an optional front surface field (FSF) 508 and an ARC 510. The FSF 508 may include an n+ doped c-Si layer when the substrate is n-type. In this embodiment, the BSF contacts 502 include a crystalline layer 512 (e.g., n+ c-Si:H), which is similar to layer 144, a non-crystalline layer 514 (e.g., n+ a-Si:H), which is similar to layer 142, a TCO layer 516 and a conductive contact layer 518. The emitter contacts 504 include an intrinsic layer 520 (e.g., a-Si:H), a p+ doped non-crystalline layer (a-Si:H) 522, a TCO layer 516 and a contact layer 518. The IBC 500 has the emitter and BSF contacts formed on a same side of the substrate 506, this means either a front side or a back side.

Figure 6:
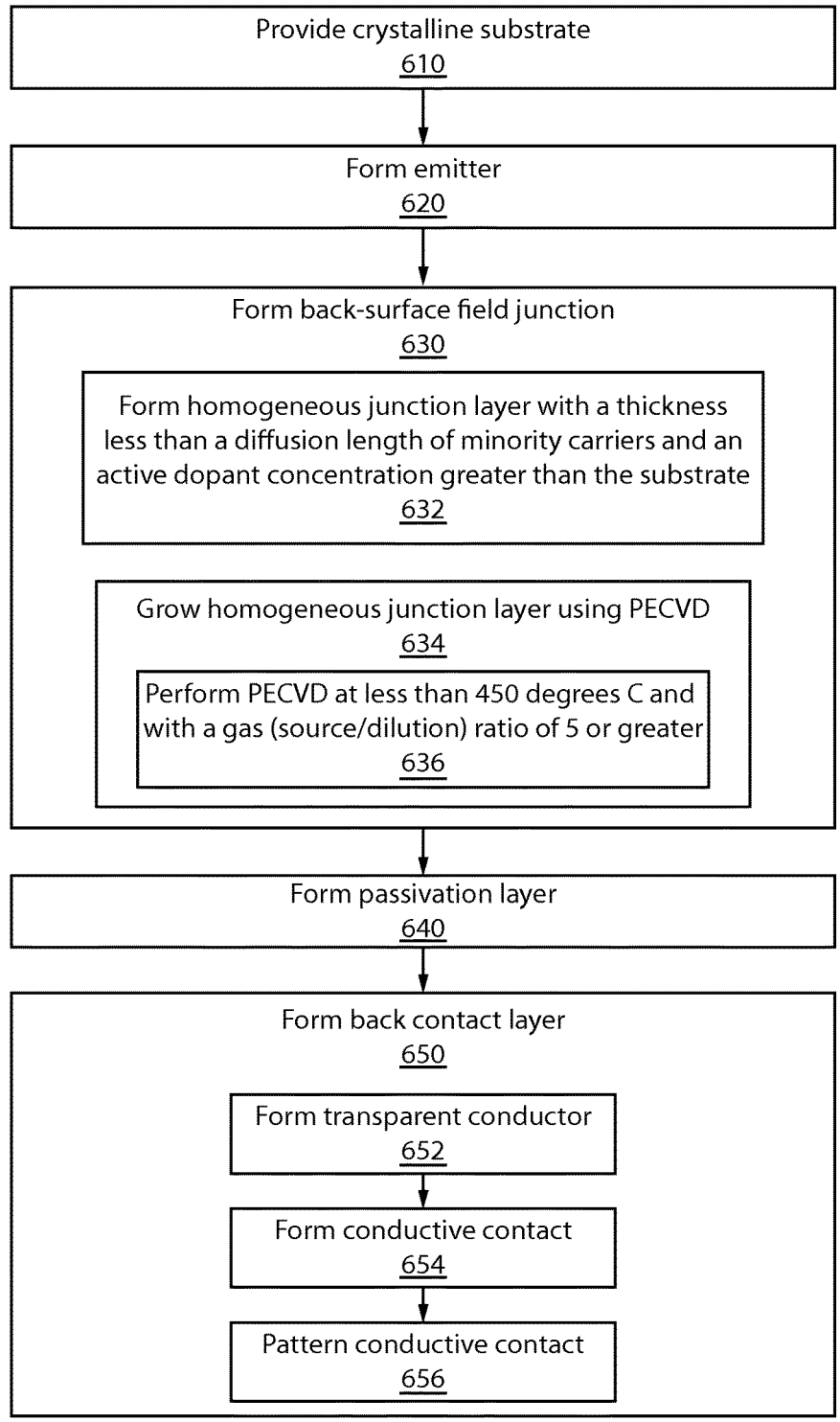
FIG. 6 is a block/flow diagram for fabricating a photovoltaic device with a back-surface-field contact in accordance with the present principles.

Referring to FIG. 6, a block/flow diagram shows a method for forming a photovoltaic device in accordance with the present principles. In block 610, a crystalline substrate is provided. In block 620, an emitter contact portion is formed in contact with the substrate. In block 630, a back-surface-field junction is formed. In block 632, a homogeneous junction layer is formed in contact with the crystalline substrate. The homogeneous junction layer includes a same conductivity type and a higher active doping density than that of the substrate. The active doping density may be in a range of between about $10^{18}$ and about $3\times10^{20}$ $cm^{-3}$. The homogeneous junction layer includes a thickness less than a diffusion length of minority carriers in the homogeneous junction layer. The homogeneous junction layer may include a thickness in the range of between about 1 to about 25 nm.

In particularly useful embodiments, forming the homogeneous junction layer includes forming a hydrogenated single-crystalline or poly-crystalline material having between 5 and 40 atomic percent hydrogen. The hydrogenated single-crystalline or poly-crystalline material preferably includes Si, although other materials are also contemplated.

In block 634, the homogeneous junction layer is grown by plasma enhanced chemical vapor deposition. In block 636, the plasma enhanced chemical vapor deposition is performed at less than 450 degrees C. and more preferably at between about 150 and 200 degrees C. In block 638, the plasma enhanced chemical vapor deposition includes a source gas, e.g., silane if Si is employed and a dilution gas, e.g., hydrogen, and a gas ratio of source gas to dilution gas of about 5 or greater is employed.

In block 640, a passivation layer is formed on the homogeneous junction layer. The passivation layer may be undoped or have the same conductivity type as that of the substrate. The passivation layer may include a hydrogenated amorphous, nano-crystalline or micro-crystalline material including a same element as the homogeneous junction layer. The same element may include Si, although other materials are also contemplated. The passivation layer may include a thickness in a range of between about 2 nm and about 20 nm. The substrate, the homogeneous junction layer, and the passivation layer preferably include a same conductivity type.

In block 650, a back contact layer is formed. In block 652, a transparent conductor may be formed on the passivation layer. In block 654, a conductive contact may be formed on the transparent conductor. This layer may include a reflective material (e.g., especially in a monofacial embodiment). In block 656, the conductive contact may be patterned, e.g., using lithography or the like, to form conductive fingers or lines, e.g., in a bifacial device.

Having described preferred embodiments of an embedded junction in hetero-structured back-surface field for photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
    a crystalline substrate;
    an emitter contact portion consisting of an intrinsic layer and a doped layer formed directly adjacent to each other, the intrinsic layer in direct contact with the substrate and the doped layer in direct contact with a first transparent conductive layer; and a back-surface-field junction including:

a planar and continuous homogeneous junction layer in contact with an entirety of a rear surface of the crystalline substrate having a same conductivity type and a higher active doping density than that of the substrate, wherein the homogeneous junction layer includes a thickness less than a diffusion length of minority carriers in the homogeneous junction layer; and a first surface of a passivation layer formed in contact with the homogeneous junction layer opposite the substrate, which is either doped or undoped, and a second surface of the passivation layer formed in direct contact with a second transparent conductive layer.

2. The photovoltaic device of claim 1, wherein the homogeneous junction layer includes hydrogenated single-crystalline or poly-crystalline material.

3. The photovoltaic device of claim 2, wherein the hydrogenated single-crystalline or poly-crystalline material includes Si having between 5 and 40 atomic percent hydrogen.

4. The photovoltaic device of claim 1, wherein the passivation layer includes hydrogenated amorphous, nano-crystalline or micro-crystalline material including a same element as the homogeneous junction layer.

5. The photovoltaic device of claim 4, wherein the same element is Si.

6. The photovoltaic device of claim 1, wherein the homogeneous junction layer has an active doping density in a range of between about $10^{18}$ and about $3 \times 10^{20}$ cm$^{-3}$.

7. The photovoltaic device of claim 1, wherein the homogeneous junction layer includes a thickness in the range of between about 1 to about 25 nm.

8. The photovoltaic device of claim 1, wherein the passivation layer has a thickness in a range of between about 2 and about 20 nm.

9. The photovoltaic device of claim 1, wherein the substrate, the homogeneous junction layer, and the passivation layer include a same conductivity type.

10. The photovoltaic device of claim 1, wherein the crystalline substrate includes a mono-crystalline or multi-crystalline substrate.

11. A photovoltaic device, comprising:

a substrate comprised of mono-crystalline or multi-crystalline material;

an emitter contact portion consisting of an intrinsic layer and a doped layer formed directly adjacent to each other, the intrinsic layer in direct contact with the substrate and the doped layer in direct contact with a first transparent conductive layer; and a back-surface-field junction including:

a planar and continuous homogeneous junction layer in contact with an entirety of a rear surface of the substrate, the homogeneous junction layer including a hydrogenated single-crystalline or poly-crystalline material having a same conductivity type and a higher active doping density than that of the substrate, wherein the homogeneous junction layer includes a thickness less than a diffusion length of minority carriers in the homogeneous junction layer, wherein the diffusion length of the minority carriers ranges from 50 nm to 2 microns;

a first surface of a passivation layer formed in contact with the homogeneous junction layer opposite the substrate, which is either doped or undoped, and a second surface of the passivation layer formed in direct contact with a second transparent conductive layer; and a conductive contact portion.

12. The photovoltaic device of claim 11, wherein the homogeneous junction layer includes between 5 and 40 atomic percent hydrogen.

13. The photovoltaic device of claim 11, wherein the hydrogenated single-crystalline or poly-crystalline material includes Si.

14. The photovoltaic device of claim 11, wherein the passivation layer includes hydrogenated non-crystalline material including a same element as the homogeneous junction layer.

15. The photovoltaic device of claim 14, wherein the hydrogenated non-crystalline material includes hydrogenated amorphous Si.

16. The photovoltaic device of claim 11, wherein the homogeneous junction layer has an active doping density in a range of between about $10^{18}$ and about $3 \times 10^{20}$ cm$^{-3}$.

17. The photovoltaic device of claim 11, wherein the homogeneous junction layer includes a thickness in the range of between about 1 to about 25 nm.

18. The photovoltaic device of claim 11, wherein the passivation layer has a thickness in a range of between about 2 and about 20 nm.

* * * * *